(12) United States Patent
Bailey et al.

(10) Patent No.: US 6,372,526 B1
(45) Date of Patent: *Apr. 16, 2002

(54) METHOD OF MANUFACTURING SEMICONDUCTOR COMPONENTS

(75) Inventors: Keith W. Bailey, Mesa; Sury N. Darbha, Tempe; Prosanto K. Mukerji; Gary R. Lorenzen, both of Phoenix, all of AZ (US)

(73) Assignee: Semiconductor Components Industries LLC, Phoenix, AZ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/055,458

(22) Filed: Apr. 6, 1998

(51) Int. Cl.$^7$ ............................................... H01L 21/66
(52) U.S. Cl. ..................... 438/15; 438/110; 438/112; 438/123
(58) Field of Search .................. 438/111, 15, 14, 438/106, 107, 112, 110, 123; 29/593, 827, 841, 850; 257/666, 668, 676, 704, 673, 773, 784

(56) References Cited

U.S. PATENT DOCUMENTS

| | | | | |
|---|---|---|---|---|
| 2,869,053 A | * | 1/1959 | Schaper | 257/668 |
| 3,577,633 A | * | 5/1971 | Homma | 29/576 |
| 3,689,991 A | * | 9/1972 | Aird | 29/827 |
| 3,838,984 A | * | 10/1974 | Crane et al. | 257/668 |
| 4,411,719 A | * | 10/1983 | Lindberg | 438/15 |
| 4,466,183 A | * | 8/1984 | Burns | 29/827 |
| 4,806,409 A | * | 2/1989 | Walter et al. | 29/827 |
| 4,811,081 A | * | 3/1989 | Lyden | 257/746 |
| 4,944,850 A | * | 7/1990 | Dion | 29/827 |
| 4,949,155 A | * | 8/1990 | Tajima et al. | 257/668 |
| 4,961,984 A | * | 10/1990 | Takeda | 428/192 |
| 5,063,434 A | * | 11/1991 | Emoto | 257/704 |
| 5,133,118 A | * | 7/1992 | Lindblad et al. | 438/15 |
| 5,148,266 A | | 9/1992 | Khandros et al. | 257/773 |
| 5,442,229 A | * | 8/1995 | Mori et al. | 257/666 |
| 5,541,451 A | * | 7/1996 | Kusumi | 257/704 |

OTHER PUBLICATIONS

Patrick Thompson–Motorola, Inc., "Chip–scale Packaging", IEEE Spectrum, Aug. 1997, pp. 36–43.
Motorola Semiconductor Master Selection Guide–SG73/D–REV6, "Tape and Reel Logic and Analog Technologies, and MOS Integrated Circuits", 1993, pp. 4.11–8, 4.11–10, and 4.11–11.
"Electronic Packaging & Interconnection Handbook", 2nd edition, Harper, 1997, pp. 234 and 235.*

* cited by examiner

*Primary Examiner*—Olik Chaudhuri
*Assistant Examiner*—Alonzo Chambliss

(57) ABSTRACT

A method of manufacturing semiconductor components (200, 400, 700) includes assembling, packaging, and testing the semiconductor components (200, 400, 700) while the semiconductor components (200, 400, 700) are mounted on an adhesive layer (220). The method of can also keep the semiconductor components (200, 400, 700) mounted on the adhesive layer (220) between each of the assembling, packaging, and testing steps.

10 Claims, 2 Drawing Sheets

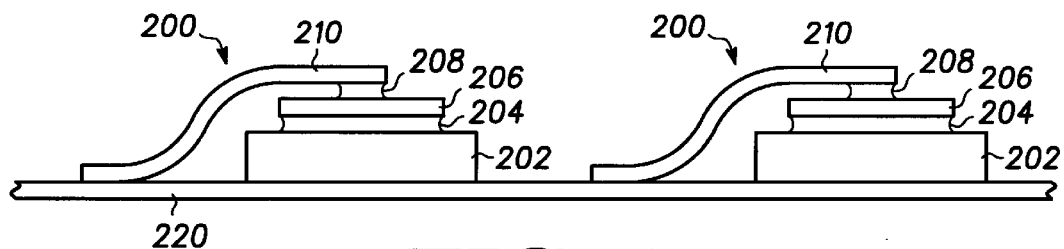
FIG. 2
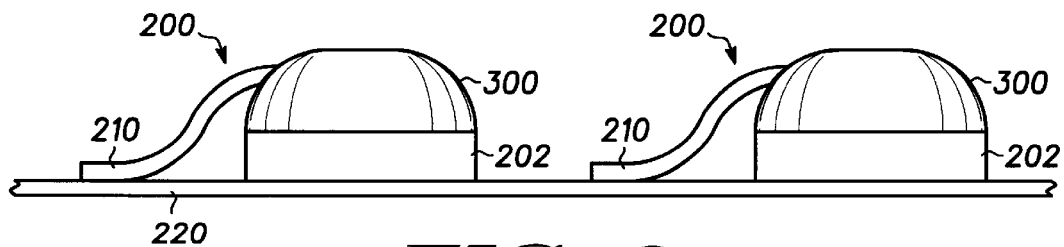
FIG. 3
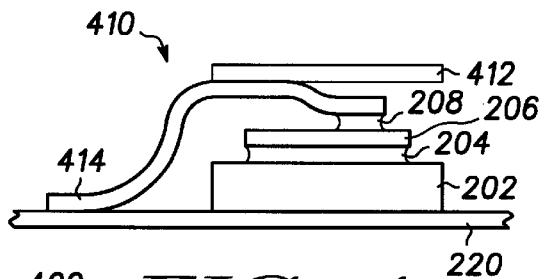
400  FIG. 4
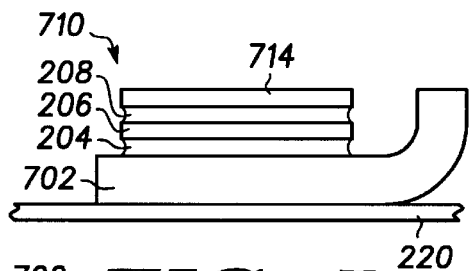
700  FIG. 7
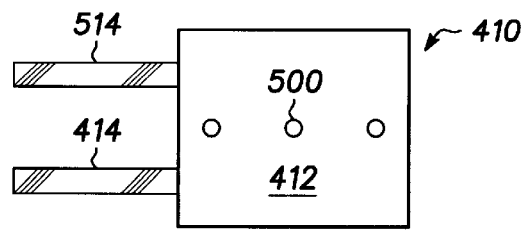
400  FIG. 5
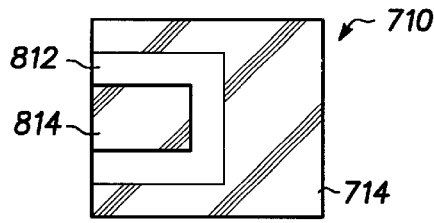
FIG. 8
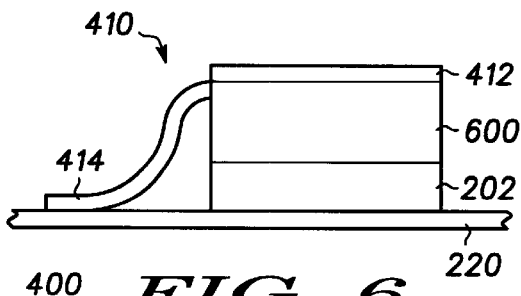
400  FIG. 6

METHOD OF MANUFACTURING SEMICONDUCTOR COMPONENTS

BACKGROUND OF THE INVENTION

This invention relates, in general, to semiconductor components, and more particularly, to methods of manufacturing semiconductor components.

After semiconductor devices are formed in a semiconductor wafer and after the wafer is singulated into individual semiconductor substrates or dice, the dice are assembled into packages or components. This assembly process includes, among other steps, attaching electrical leads to each of the dice and encapsulating each of the dice. However, the assembly process is very expensive and time consuming.

Accordingly, a need exists for an inexpensive and quick method of manufacturing semiconductor components.

BRIEF DESCRIPTION OF THE DRAWINGS

FIGS. 2 and 3 illustrate side views of an embodiment of semiconductor components during the manufacturing method of FIG. 1;

FIG. 4 illustrates a side view of an alternative embodiment of the semiconductor components of FIG. 2;

FIG. 5 illustrates a top view of the semiconductor component of FIG. 4;

FIG. 6 illustrates a side view of the semiconductor component of FIG. 4 after subsequent manufacturing steps;

FIG. 7 illustrates a side view of another alternative embodiment of the semiconductor components of FIG. 2; and FIG. 8 illustrates a top view of a portion of the semiconductor component of FIG. 7.

For simplicity and clarity of illustration, elements in the drawings are not necessarily drawn to scale, and the same reference numerals in different figures denote the same elements.

DETAILED DESCRIPTION OF THE DRAWINGS

Figure 1:
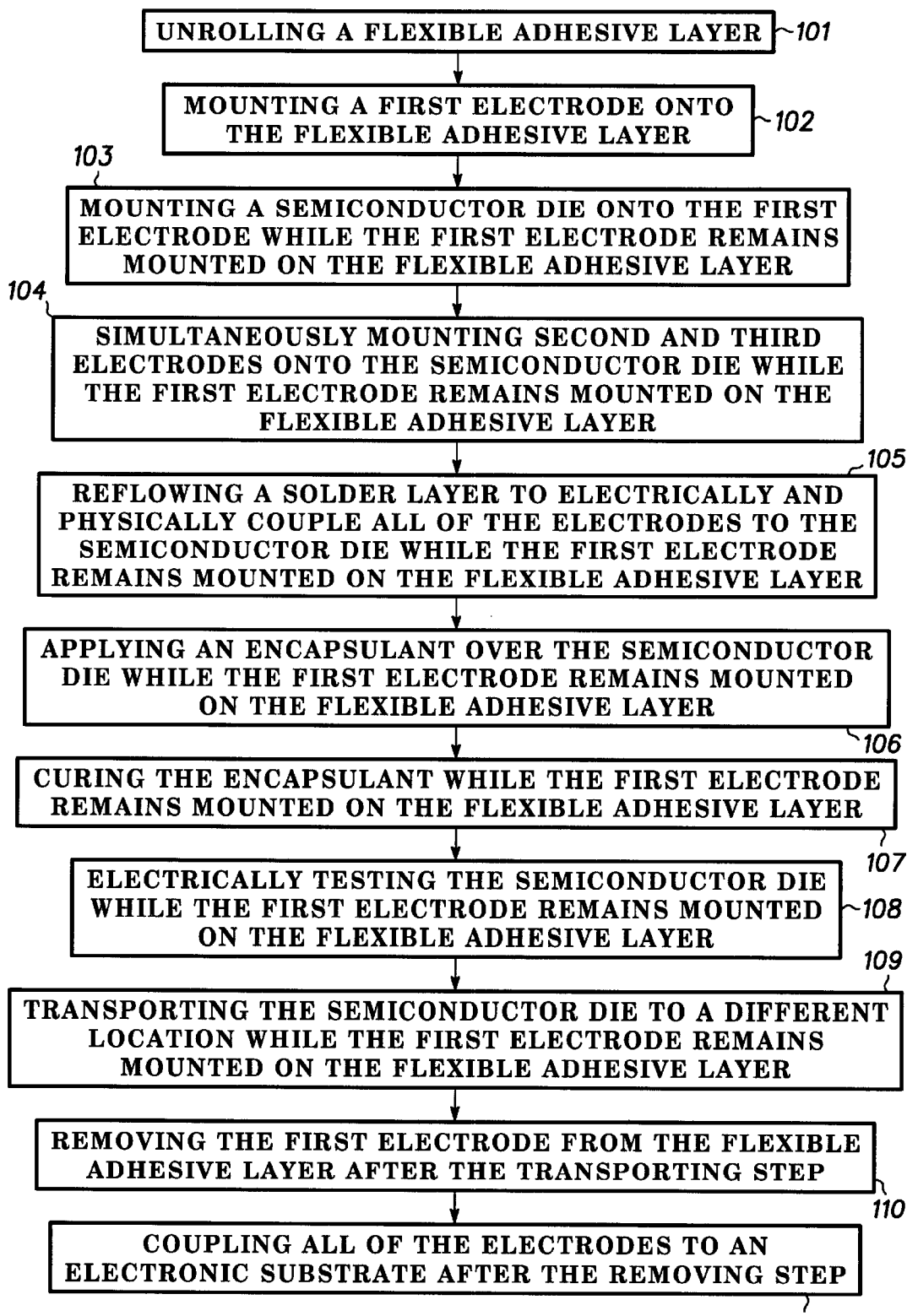
FIG. 1 outlines a method of manufacturing semiconductor components in accordance with the present invention.

FIG. 1 outlines a method 100 of manufacturing semiconductor components. The preferred embodiment of method 100 assembles, packages, and electrically tests semiconductor components while the semiconductor components are mounted on a flexible adhesive layer. The semiconductor components preferably remain mounted on the flexible adhesive layer between each of the assembling, packaging, and testing steps. Furthermore, the flexible adhesive layer preferably serves as a conveyor belt transporting the semiconductor components from one step or processing station to the next.

Method 100 includes a step 101 for removing a support layer or carrier tape from a dispenser. In the preferred embodiment, the support layer is a flexible layer that is preferably unrolled from a tape reel and that has an adhesive side and a non-adhesive side opposite the adhesive side. The support layer should be able to withstand elevated temperatures during the solder reflow and encapsulant curing steps described hereinafter. The support layer can also be referred to as a carrier tape, film, or substrate. In an alternative embodiment, the support layer can be semi-flexible, semi-rigid, or rigid. The following description of subsequent steps in method 100 will mainly refer to the preferred embodiment of the support layer.

Method 100 continues with sequential steps 102, 103, 104, and 105 for coupling leads or attaching electrodes to a semiconductor substrate supported by the flexible adhesive layer.

Step 102 couples, attaches, or mounts planar leads or electrodes onto the adhesive side of the flexible adhesive layer.

Step 103 couples, attaches, or mounts semiconductor substrates or dice to the planar electrodes while the electrodes remain mounted on the flexible adhesive layer. A first surface of each of the semiconductor dice faces towards the flexible adhesive layer and the planar electrodes. Each of the semiconductor dice contain at least one semiconductor device such as, for example, an insulated gate bipolar transistor. Furthermore, each of the semiconductor dice has previously been singulated from a larger semiconductor substrate or wafer.

Step 104 couples, attaches, or mounts additional leads or electrodes to the semiconductor dice while the first electrodes remain mounted on the flexible adhesive layer. A second surface of each of the semiconductor dice faces towards the additional electrodes wherein the second surface is opposite the first surface of the semiconductor dice. The alignment of the semiconductor dice to the planar electrodes and the alignment of the additional electrodes to the semiconductor dice can be accomplished by automated alignment equipment.

Step 105 reflows solder layers between the semiconductor dice and the planar and additional electrodes to electrically and physically couple the semiconductor dice to the planar and additional electrodes. Step 105 is performed while the planar electrodes remain mounted on or supported by the flexible adhesive layer. As an example, the solder layers can be preforms or paste disposed between the semiconductor dice and the electrodes before step 105. Alternatively, the solder layers can be solder pads formed using electroplating or electroless plating techniques.

Next, method 100 continues with sequential steps 106 and 107 for packaging the semiconductor dice supported by the flexible adhesive layer.

Step 106 disposes or applies a packaging material or encapsulant over the semiconductor dice while the planar electrodes remain mounted on or supported by the flexible layer. A portion of the additional electrodes are also protected by the packaging material during step 106. In the preferred embodiment, the packaging material remains on top of the planar leads. As an example, the encapsulant can be a glob top material.

Step 107 cures the encapsulants while the planar electrodes remain mounted on or supported by the flexible adhesive layer. As an example, the curing step can be accomplished by ultraviolet or thermal techniques in an oven.

Then, method 100 continues with a step 108 for electrically or functionally testing the semiconductor dice while the planar electrodes remain mounted on or supported by the flexible adhesive layer.

After the functional test, the flexible adhesive layer is inserted into a collector and is moved, carried, or transported to a different location during a step 109. The planar electrodes remain mounted on the flexible adhesive layer during step 109. In the preferred embodiment, the flexible adhesive layer is rolled onto a reel similar to the reel from which the flexible adhesive layer was dispensed in step 101. Furthermore; the reel and the flexible adhesive layer preferably serve as a packaging container or a transportation container for the semiconductor components. Also in the preferred embodiment, step 109 transports the semiconductor component from a semiconductor component manufacturer or supplier to a buyer or electronic component manufacturer.

Next, method 100 continues with a step 110 for separating or removing the planar electrodes, and thus the semiconductor component, from the flexible adhesive layer. Before the semiconductor components are removed from the flexible adhesive layer, step 110 dispenses or removes the flexible adhesive layer from the reel while the planar electrodes remain mounted on the flexible adhesive layer.

Then, method 100 continues with a step 111 for coupling, attaching, or mounting the additional and planar electrodes to electronic substrates or circuit boards to form electronic components.

FIGS. 2 and 3 illustrate side views of semiconductor components 200 during manufacturing method 100 of FIG. 1. Components 200 are identical to each other and are mounted on or supported by a carrier tape, film, substrate, support, or transport layer 220. As discussed earlier, layer 220 is preferably a flexible, one-sided adhesive layer. As an example, layer 220 can be comprised of TEFLON® material, a polyimide, or a glass cloth.

Each of components 200 include a planar electrically conductive lead or electrode 202, a semiconductor substrate or die 206, and an additional electrically conductive lead or electrode 210. Electrode 202 also preferably serves as a heatsink for components 200. Accordingly, electrode 202 is preferably comprised of a solid piece of metal and is preferably larger than die 206. As illustrated in FIG. 2, each of components 200 also include a solder layer 204 between die 206 and electrode 202 and further include an additional solder layer 208 between die 206 and electrode 210. As illustrated in FIG. 3, each of components 200 also include a packaging material or encapsulant 300.

During steps 110 and 111 of FIG. 1, components 200 are removed from layer 220 and coupled to a circuit board (not shown). Electrode 202 is coplanar with an end of electrode 210 to provide a flat coupling surface with the circuit board. The assembly of electrodes 202 and 210 on a planar surface, such as layer 220, ensures the coplanarity of electrode 202 and the end of electrode 210.

FIG. 4 illustrates a side view of a semiconductor component 400, which is an alternative embodiment of components 200 of FIG. 2. FIG. 5 illustrates a top view of component 400. Component 400 includes an interconnect structure or portion 410, which replaces electrode 210 in component 200 of FIG. 2. Portion 410 includes an electrically insulative substrate or portion 412 and electrical leads or electrodes 414 and 514. Electrodes 414 and 514 are physically coupled to portion 412 before electrodes 414 and 514 are aligned and electrically coupled to die 206 during step 104 in method 100 of FIG. 1. In this embodiment, step 104 simultaneously couples, mounts or attaches two electrodes to a semiconductor die. Therefore, instead of using two separate alignment steps or one alignment step for each electrode, the simultaneous mounting step only requires a single alignment step for a plurality of electrodes. The simultaneous mounting step saves time and is more cost effective compared to separate mounting steps for each electrode.

Electrodes 414 and 514 can be attached to portion 412 by using an adhesive or by molding electrodes 414 and 514 into portion 412. Portion 412 includes vias or holes 500 extending entirely through portion 412 to facilitate the packaging or encapsulation process in step 106 of FIG. 1, which is explained in more detail hereinafter. In the preferred embodiment, electrodes 414 and 514 are base and collector electrodes while electrode 202 (FIG. 4) is an emitter electrode for component 400.

FIG. 6 illustrates a side view of component 400 after manufacturing steps 106 and 107 of FIG. 1. As illustrated in FIG. 6, component 400 includes a packaging material or encapsulant 600 protecting or encapsulating die 206 (FIG. 4). Holes 500 (FIG. 5) in portion 412 facilitate disposing encapsulant 600 around die 206. Electrodes 414 and 514 should not cover or otherwise block holes 500.

In one embodiment, a top surface of portion 412 forms an entire outer surface of component 400, as illustrated in FIG. 6. In this embodiment, portion 412 should be comprised of a rigid material. This embodiment improves the cosmetic appearance of component 400 by easily providing a smooth outer surface.

FIG. 7 illustrates a side view of a semiconductor component 700, which is another alternative embodiment of components 200 of FIG. 2. As illustrated in FIG. 7, component 700 includes an electrical lead or electrode 702 coupled, attached, or mounted onto layer 220 during step 102 of FIG. 1. Electrode 702 of component 700 replaces electrode 202 in component 200 of FIG. 2. Electrode 702 has an end portion extending up and away from layer 220. Component 700 also includes an interconnect structure or portion 710, which replaces electrode 210 in component 200 of FIG. 2. Portion 710 includes a lead or electrode 714 and is explained in more detail hereinafter.

As depicted in FIG. 7, the packaging process of steps 106 and 107 of FIG. 1 have not been performed on component 700. If steps 106S and 107 are performed, then an encapsulant or packaging material preferably rest entirely on top of electrode 702 and leave the top surface of portion 710 and the tip of the end portion of electrode 702 exposed, for reasons explained hereinafter.

FIG. 8 illustrates a top view of portion 710 of component 700. Portion 710 includes electrode 714, a lead or electrode 814, and an insulative substrate or portion 812. Electrodes 714 and 814 are physically coupled together by portion 812 before electrodes 714 and 814 are aligned and electrically coupled to die 206 (FIG. 7) during step 104 of method 100 in FIG. 1. In this embodiment, step 104 simultaneously couples, mounts or attaches two electrodes to a semiconductor die. Therefore, instead of using two separate alignment steps or one alignment step for each electrode, the simultaneous mounting step only requires a single alignment step. Therefore, simultaneous mounting saves time and is more cost effective.

Electrodes 714 and 814 can be attached to portion 812 by using an adhesive. Alternatively, portion 812 itself can be an adhesive. In yet another alternative embodiment, portion 710 can be manufactured by forming a recess in an elongated electrode 714, filling the recess with an elongated portion 812, forming a recess in portion 812, filling the recess with an elongated electrode 814, and then cutting or slicing the elongated structure into a plurality of portions 710. In the preferred embodiment, electrodes 714 and 814 are collector and base electrodes, respectively, while electrode 202 (FIG. 4) is an emitter electrode for component 700.

In one embodiment of component 700, a top surface of portion 710 forms an outer surface of component 700. In this embodiment, portion 812 should be comprised of a rigid material. This embodiment improves the planarity and cosmetic appearance of component 400 by easily providing a smooth outer surface. This outer surface is also the electrical coupling surface for electrodes 714 and 814. In this embodiment, the top surface of portion 710 is coplanar with a coupling surface of the end portion of electrode 702. One significant advantage of component 700 is space savings. For example, the profile and foot print of component 700 are much smaller than conventional components. Additionally, the electrical performance of component 700 is improved due to a decrease in the on-resistance.

Therefore, an improved method of manufacturing semiconductor components is provided to overcome the disadvantages of the prior art. The method simplifies the assembly, packaging, and testing processes compared to the prior art. For example, a single alignment step can be used to couple a plurality of electrodes or leads to a semiconductor substrate. Additionally, expensive leadframe and encapsulation materials are eliminated. Furthermore, some conventional assembly and packaging steps such as, for example, lead bending, lead trimming, and lead singulation, are eliminated. As an example, eliminating the lead trimming step reduces scrap. Moreover, the component is assembled, packaged, tested, and shipped on the same support substrate. These features improve the cycle time and reduce the cost associated with manufacturing semiconductor components.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, the material composition for layer 220 are provided to facilitate the understanding of the present invention and are not provided to limit the scope of the invention. As another example, layer 220 can be wide enough to support several components across its width. Additionally, layer 220 can have guide holes at its edges for gears or other devices to move layer 220 from one processing station to the next. Furthermore, layer 220 can be entirely non-adhesive, and electrodes 202 and 702 can be adhesive. Moreover, layer 220 can have mechanical locking features for retaining electrodes 202 and 702.

Accordingly, the disclosure of the present invention is not intended to be limiting. Instead, the disclosure of the present invention is intended to be merely illustrative of the scope of the invention, which is set forth in the following claims.

What is claimed is:

1. A method of manufacturing a semiconductor component, comprising
    providing a support layer;
    attaching a conductive lead to the support layer;
    attaching a first surface of a semiconductor device to the conductive lead wherein the entire first surface is in contact with the conductive lead;
    providing a substrate;
    attaching a plurality of electrodes to the substrate to form an electrode assembly;
    attaching the electrode assembly to a second surface of the semiconductor device to simultaneously mount the plurality of electrodes to the second surface of the semiconductor device;
    encapsulating the semiconductor device while the conductive lead remains attached to the support layer; and
    electrically testing the semiconductor device while the conductive lead remains attached to the support layer.

2. The method of claim 1 wherein encapsulating the semiconductor device comprises:
    applying an encapsulant over the semiconductor device; and
    curing the encapsulant.

3. A method of manufacturing a semiconductor component, comprising:
    attaching a first Surface of a semiconductor device to a carrier strip wherein a conductive lead provides a mounting surface for the semiconductor device to the carrier strip;
    attaching a plurality of electrodes to a substrate to form an assembly;
    attaching the assembly to a second surface of the semiconductor device opposite the first surface to simultaneously attach the plurality of electrodes to the second surface of the semiconductor device;
    encapsulating the semiconductor device while the conductive lead remains attached to the carrier strip; and
    electrically testing the semiconductor device while the conductive lead remains attached to the carrier strip.

4. The method of claim 3 wherein encapsulating the semiconductor device comprises:
    applying an encapsulant over the semiconductor device; and
    curing the encapsulant.

5. A method of manufacturing a semiconductor component, comprising:
    attaching a semiconductor device to a non-conductive support strip wherein an attached surface of the semiconductor device is a conductive lead;
    attaching a plurality of electrodes to a substrate to form an electrode assembly;
    mounting the electrode assembly to a surface opposite the attached surface of the semiconductor device;
    encapsulating the semiconductor device while the conductive lead remains attached to the non-conductive support strip; and
    performing electrical testing of the semiconductor device while the conductive lead remains attached to the support strip.

6. The method of claim 5, wherein attaching the semiconductor device to the non-conductive support strip comprises:
    placing a first surface of the conductive lead against an adhesive layer of the non-conductive support strip;
    applying a solder layer to a second surface of the conductive lead; and
    attaching the semiconductor device to the solder layer.

7. The method of claim 6 wherein attaching the semiconductor device further includes reflowing the solder layer to produce an electrical contact between the conductive lead and the semiconductor device.

8. The method of claim 5 wherein encapsulating the semiconductor device comprises:
    applying an encapsulant over the semiconductor device; and
    curing the encapsulant.

9. The method of claim 5 wherein performing electrical testing of the semiconductor device comprises utilizing the support strip for support during the electrical testing.

10. The method of claim 5 wherein mounting the electrode assembly comprises simultaneously attaching the plurality of electrodes to the surface opposite the attached surface of the semiconductor device.

* * * * *